United States Patent
Chen et al.

(10) Patent No.: US 7,390,697 B2
(45) Date of Patent: Jun. 24, 2008

(54) ENHANCED ADHESION STRENGTH BETWEEN MOLD RESIN AND POLYIMIDE

(75) Inventors: Ken Chen, Hsinchu (TW); Chender Huang, Hsin-Chu (TW); Pei-Haw Tsao, Taichung (TW); Jones Wang, Jung-he (TW); Hank Huang, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 398 days.

(21) Appl. No.: 11/059,732

(22) Filed: Feb. 17, 2005

(65) Prior Publication Data

US 2005/0167807 A1   Aug. 4, 2005

Related U.S. Application Data

(63) Continuation of application No. 10/058,473, filed on Jan. 28, 2002, now Pat. No. 6,884,662.

(51) Int. Cl.
*H01L 21/44* (2006.01)

(52) U.S. Cl. .................. 438/106; 257/E21.508

(58) Field of Classification Search ............... 438/478, 438/184, 193, 195–198, 200–203, 206–207, 438/209–211, 218, 237, 165, 294, 308, 337, 438/353, 6, 10, 104, 107–114, 118, 121–123, 438/128–129, 135, 142, 145, 149, 151, 157, 438/176

See application file for complete search history.

(56) References Cited

U.S. PATENT DOCUMENTS

| | | | |
|---|---|---|---|
| 5,048,179 A | 9/1991 | Shindo et al. | 29/840 |
| 5,883,001 A | 3/1999 | Jin et al. | 438/624 |
| 5,937,279 A | 8/1999 | Sawada et al. | 438/123 |
| 5,940,277 A | 8/1999 | Farnworth et al. | 361/760 |
| 6,074,895 A | 6/2000 | Dery et al. | 438/108 |
| 6,191,023 B1 | 2/2001 | Chen | 438/612 |
| 6,197,613 B1 * | 3/2001 | Kung et al. | 438/106 |
| 6,277,672 B1 | 8/2001 | Ho | 438/121 |
| 6,294,454 B1 | 9/2001 | Koike | 438/612 |
| 6,329,288 B1 | 12/2001 | Tokushige et al. | 438/675 |
| 6,489,237 B1 | 12/2002 | Wu | 438/671 |
| 6,593,649 B1 | 7/2003 | Lin et al. | 257/697 |
| 2003/0096449 A1 * | 5/2003 | Hashimoto | 438/106 |
| 2003/0104649 A1 * | 6/2003 | Ozgur et al. | 438/50 |

* cited by examiner

*Primary Examiner*—Michael S. Lebentritt
*Assistant Examiner*—Andre' Stevenson
(74) *Attorney, Agent, or Firm*—Thomas, Kayden, Horstemeyer & Risley

(57) ABSTRACT

A new method is provided for the interface between a stress relieve interface layer of polyimide and a thereover created layer of mold compound. The invention provides for creating a pattern in the stress relieve layer of polyimide before the layer of mold compound is formed over the stress relieve layer of polyimide.

14 Claims, 3 Drawing Sheets

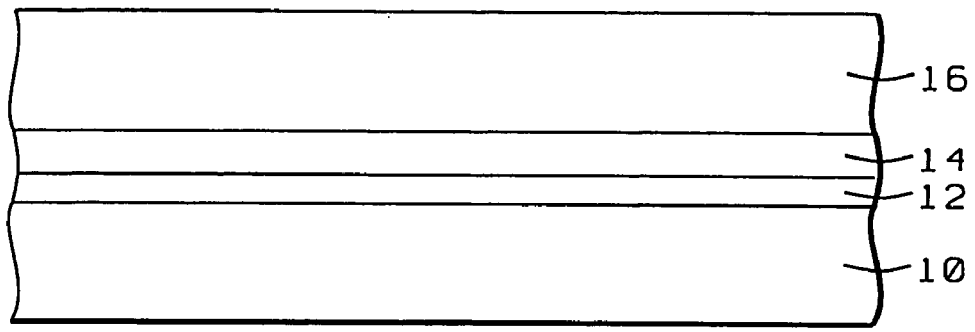
FIG. 1a – Prior Art
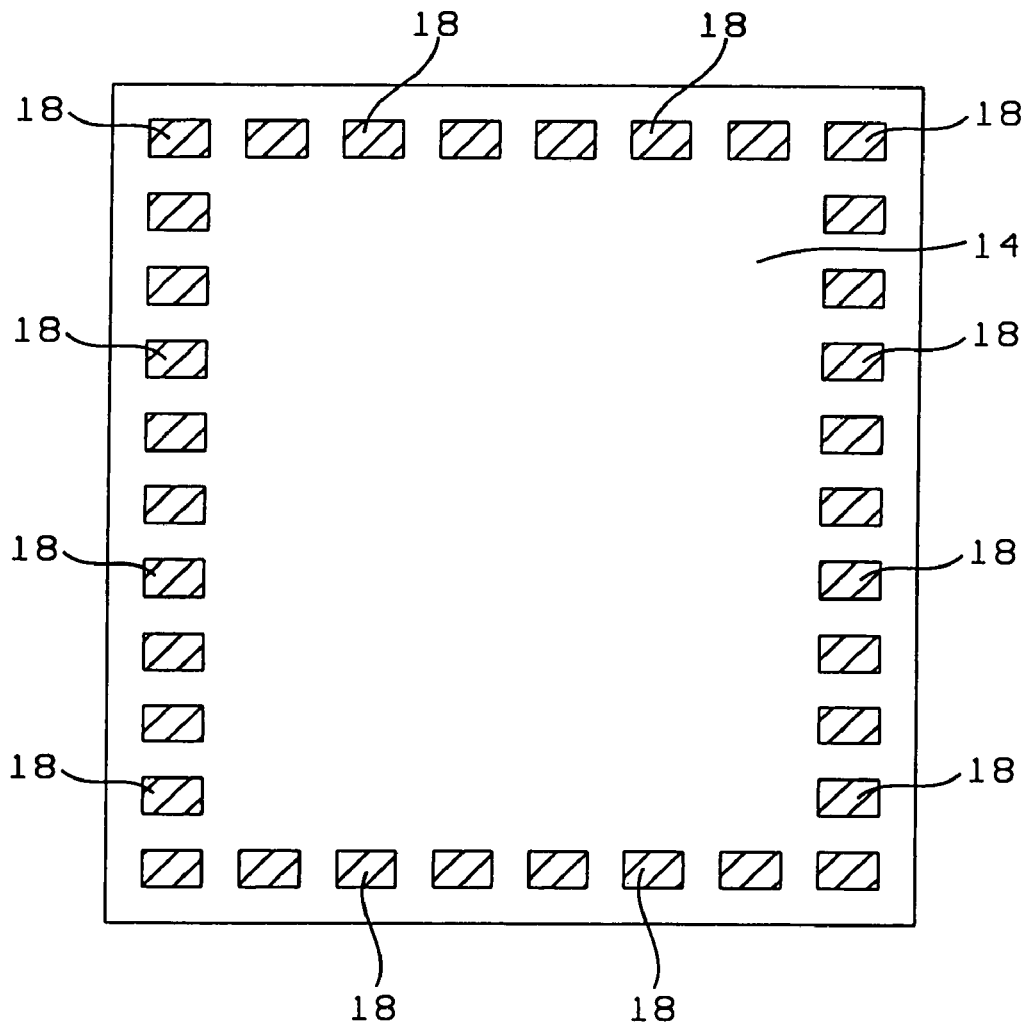
FIG. 1b – Prior Art

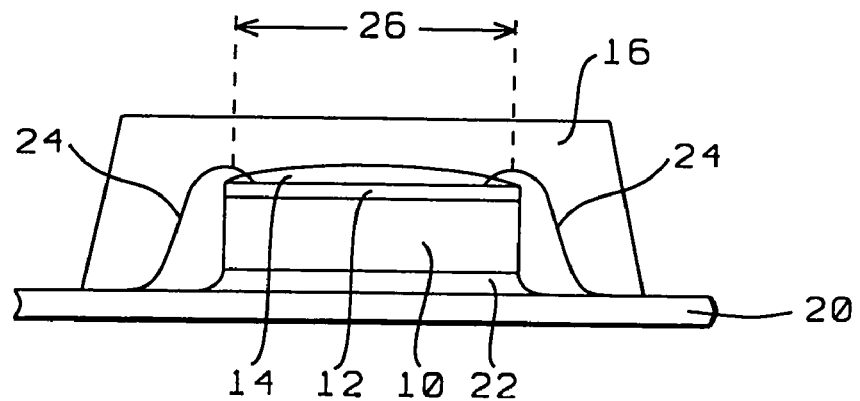
FIG. 1c – Prior Art
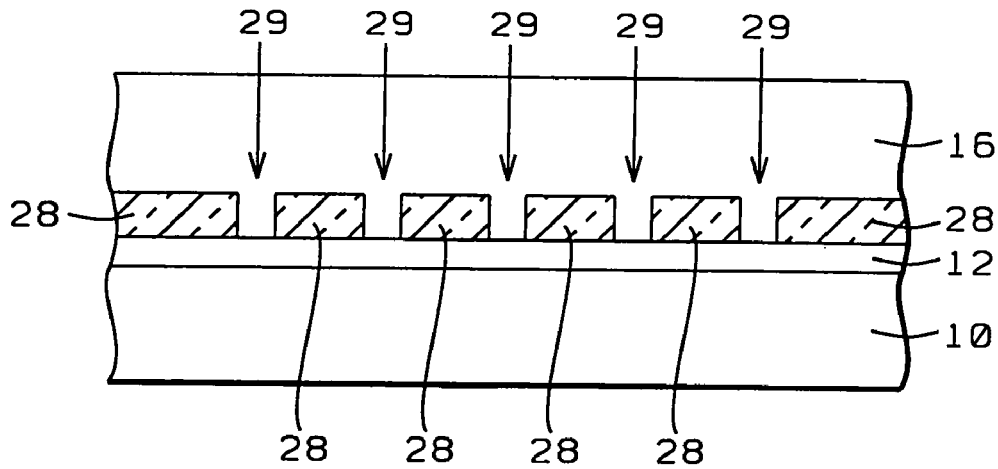
FIG. 2a
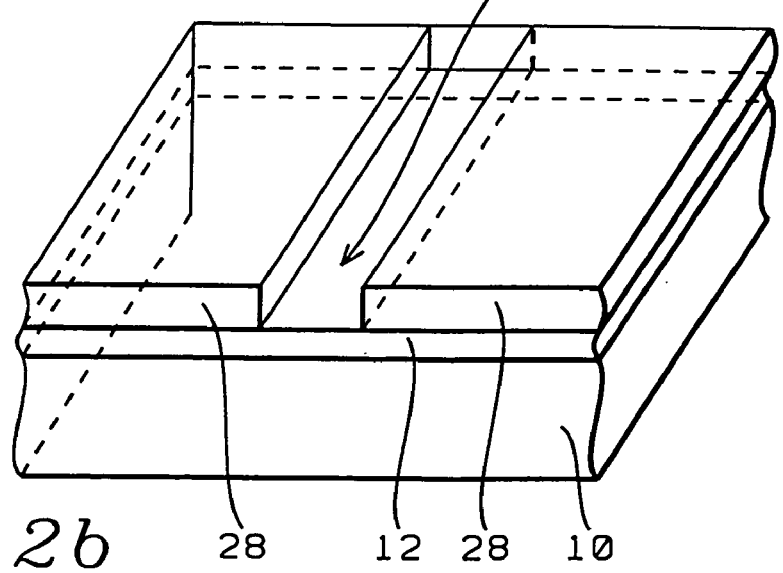
FIG. 2b

ENHANCED ADHESION STRENGTH BETWEEN MOLD RESIN AND POLYIMIDE

CROSS-REFERENCE TO RELATED APPLICATION

This application is a continuation of U.S. patent application Ser. No. 10/058,473, filed Jan. 28, 2002 now U.S. Pat. No. 6,884,662.

BACKGROUND OF THE INVENTION (1) Field of the Invention

The invention relates to the fabrication of integrated circuit devices, and more particularly, to a method that provides enhanced adhesion strength between layers of mold resin and adjacent layers of polyimide.

(2) Description of the Prior Art

For the creation of conventional semiconductor devices, the surface of the completed device is typically covered with a relatively thick layer of passivation to protect this surface against such detrimental impacts as mechanical damage and scratching or foreign particles accumulating on or otherwise affecting the surface of the semiconductor device. A protective layer may furthermore be used to protect the completed semiconductor device against mechanical or thermal stress that may be introduced during and as a consequence of additional packaging operations of the device. As a consequence, a protective layer that is created over the surface of a completed semiconductor device must be resistant to thermal and mechanical stress, the layer must not be affected by chemical substances that may come into contact with the surface of the protective layer, the layer must have good adhesion to the surface over which the protective layer is deposited, the layer must be impervious to the penetration of moisture, must provide good electrical isolation and must be thermally matched with adjacent layers in order to accommodate different Coefficients of Thermal Expansion (CTE) of these layers.

The protective coating that is deposited over the surface of a completed semiconductor device must in many of the applications of the protective layer be penetrated in order to provide electrical and functional access to the protected semiconductor device. Contact pads to the protected device are for this purpose provided over an exposed surface of the device. The contact pads typically serve as an interface between the semiconductor device and conductive traces that further interconnect the device, frequently by means of complex and overlying layers of interconnect metal that are separated by layers of dielectric, to surrounding electrical circuitry of electrical components. For this reason, the protective layer must also support a technique, which is preferably a technique that is additionally used for other applications that are used for the creation of semiconductor device, for patterning and etching the protective layer for the creation of openings through the protective layer.

It is further required that the deposition of a protective layer provides the additional benefit of creating a surface of good planarity, even in applications where the surface over which the layer of passivation is deposited has relatively poor planarity so that the layer of passivation contributes to improving the overall planarity of the created structure. This leads to the requirement that the material that is used for the protective layer must be of a relatively viscous nature so that voids or surface irregularities in the surface over which the protective layer is deposited are filled, providing an improved surface planarity for the completed protective layer.

Of the above highlighted requirements for a layer of material that is used as a protective layer over the surface of a completed semiconductor device, the invention concentrates on potential problems that are encountered by mismatches between the Coefficients of Thermal Expansion (CTE) of adjacent and overlying layers of the package. The stresses that are introduced by CTE mismatch have long been known as leading to significant mechanical damage to the completed package such as cracking of the die supporting layer or cracking of the thereon mounted semiconductor die. Conventionally, to reduce the effect of CTE mismatch, a coating of polyimide is first deposited over the surface that is to be protected after which the protective layer is formed over the surface of the layer of polyimide.

One of the frequently applied materials for the formation of a protective layer is mold resin. It is however known in the art that there is a relatively large mismatch between the CTE of polyimide and mold resin. The invention addresses this concern by providing a new method of interfacing the deposited layer of polyimide to the thereover created layer of mold resin.

U.S. Pat. No. 5,937,279 (Sawada et al.) shows a packaging process to reduce cracks due to stress.

U.S. Pat. No. 5,883,001 (Jin et al.) shows a process to improve CU pad adhesion.

U.S. Pat. No. 5,940,277 (Farnworth et al.) and U.S. Pat. No. 5,883,001 (Jin et al.) are related patents.

SUMMARY OF THE INVENTION

A principle objective of the invention is to enhance adhesion between a layer of stress relieve material and a layer of protective material that are deposited over the surface of a completed semiconductor device.

Another objective of the invention is to reduce stress that is introduce by mismatch of the CTE of adjacent layers that are created as protective layers over the surface of a completed semiconductor device.

Yet another objective of the invention is to prevent damage to a device package or components thereof that is introduced by thermal or mechanical stress that is created in one or more of the layers of the completed package.

A still further objective of the invention is to provide a method of creating a protective layer over a completed semiconductor device where the completed semiconductor device is densely packed and has a relatively large surface area.

In accordance with the objectives of the invention a new method is provided for the interface between a stress relieve interface layer of polyimide and a thereover created layer of mold compound. The invention provides for creating a pattern in the stress relieve layer of polyimide before the layer of mold compound is formed over the stress relieve layer of polyimide.

BRIEF DESCRIPTION OF THE DRAWINGS

FIGS. 1a through 1c provide a prior art method of packaging semiconductor devices, as follows:

FIG. 1a shows a cross section of a semiconductor device over which a layer of passivation, a layer of polysilicon and a layer of mold compound have conventionally been deposited.

FIG. 1b shows a top view of a conventional layer of polysilicon.

FIG. 1c shows a cross section of a conventional semiconductor device package.

FIGS. 2a through 2c provide the method of packaging semiconductor devices of the invention, as follows:

FIG. 2a shows a cross section of a semiconductor device over the surface of which a layer of passivation, a patterned layer of polysilicon and a layer of mold compound have been deposited.

FIG. 2b shows a three dimensional view of the layers of the cross section of FIG. 2a with the exception of the layer of mold compound.

FIG. 2c shows a top view of the patterned and etched layer of polysilicon of the invention.

DESCRIPTION OF THE PREFERRED EMBODIMENTS

Figure 2C:
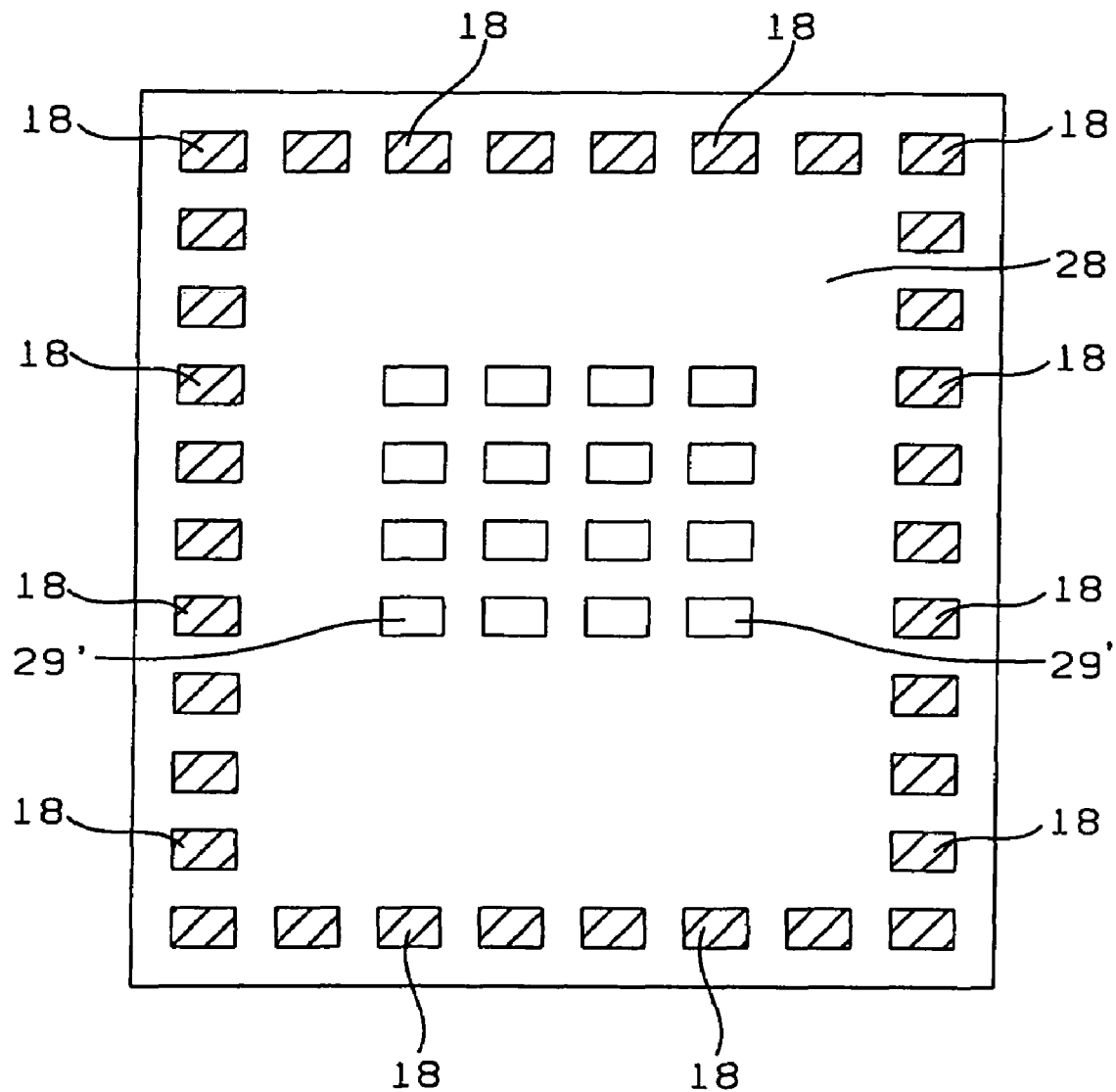

For purposes of reference and comparison, a prior art method of creating an interface between a completed semiconductor device and a thereover created protective layer is first briefly highlighted.

Referring for this purpose first to FIG. 1a, there is shown the cross section of a completed semiconductor die and a number of the layers that form part of the package into which the completed semiconductor die is mounted, as follows:

10, is the completed semiconductor device 12 is a layer of passivation that has been deposited over the surface of the completed semiconductor device 10; this layer 12 is the essential layer that is created for the previously highlighted protection of the surface of die 10 and for isolating the die 10 from damaging environmental influences 14, a layer of polyimide that forms a stress relieve layer between the passivation layer 12 and the overlying mold compound 16, the mold compound that encases and surrounds the completed and further interconnected (not shown) die 10; mold compound 16 forms an essential part of the complete semiconductor device package.

Shown in the cross section of FIG. 1a is that the interface stress relieve layer 14 of polyimide is blanket deposited over the surface of the passivation layer 12. The previously highlighted requirements that conventionally must be met by a protective layers must, for the cross section that is shown in FIG. 1a, also be met, specifically the requirement of CTE matching of adjacent layers.

The top view that is shown in FIG. 1b shows bond pads 18 that are exposed through the layer 12 of passivation and through the layer 14 of polyimide and that enable further interconnecting the semiconductor die 10 to surrounding networks of interconnect traces (not shown). The bond pads 18 are typically, as shown in the top view of FIG. 1b, provided around the perimeter of the die 10 for reasons of providing multiple Input/Output interconnects to die 10 and for reasons of easy access to and electrical performance of the die 10 in the completed package.

The cross section that is shown in FIG. 1c provides additional and simplified detail of a completed semiconductor package, where the now completed die 10 is mounted over the surface of a die support medium 20, such as the surface of a Printed Circuit Board (PCB). The die support medium 20 is not limited to being a PCB but can for example comprise semiconductor substrates, flex circuits, metallized substrates, glass substrates, whereby the semiconductor substrates can be selected from the group of substrates consisting of semiconductor substrates, ceramic substrates, glass substrates, gallium arsenide substrates, silicon substrates comprising a single layer of material, such as a silicon wafer or comprising silicon on insulator (SOI) technology and silicon on sapphire (SOS) technology, doped or undoped semiconductors, epitaxial layers of silicon supported by a base semiconductor, sapphire substrates or substrates that are used for flat panel displays.

An underfill 22, typically comprising a thermally conductive epoxy, is provided in the interface between the die 10 and the die support or mounting medium 20.

The positioning and cross sections of the passivation layer 12, the layer 14 of polyimide overlying the passivation layer 12 and the mold compound 16 are again highlighted in the completed package that is shown in cross section in FIG. 1c. Further highlighted are wire interconnects 24, which are conventional bond wires that interconnect pads 18, that are provided in the upper surface of die 10 and that are further exposed through openings (not shown in the cross section of FIG. 1c) created through the passivation layer 12, with contact pads (not shown) in the upper surface of the die support medium 20. It is well known in the art that die support medium 20 may comprise multiple layers of interconnect traces, separated by insulating layers, for further interconnect of die 10 to surrounding electrical circuitry or electrical components. Additionally, the package is frequently completed by attaching contact balls (not shown) to exposed points of contact in the lower surface of interconnect medium 20, making the package a Ball Grid Array package that provides a large number of I/O interconnect points between die 10 and surrounding networks of interconnect (not shown).

The essential reason for presenting the cross section of FIG. 1c is to highlight that the adhesion between the layer 14 of polyimide and the overlying mold compound 16 is relatively poor over an interface surface area that has been highlighted in FIG. 1c as surface area 26. It is this issue that is addressed by the invention, as will be explained in detail using FIGS. 2a through 2c.

Referring now specifically to the cross section that is shown in FIG. 2a, there are shown the following package elements:

10, the completed semiconductor device 12, a layer of passivation that has been deposited over the surface of the completed semiconductor device 10; this layer 12 is the essential layer that is created for the previously highlighted protection of the surface of die 10 and for isolating the die 10 from damaging environmental influences 28, a layer of polyimide of the invention that forms a stress relieve layer between the passivation layer 12 and the overlying mold compound 16, a mold compound that encases and surrounds the completed and further interconnected (not shown) die 10; mold compound 16 forms, as in conventional packages, an essential part of the complete semiconductor device package.

Specifically shown in the cross section of FIG. 2b is how the layer 28 of polyimide has been patterned and etched, creating openings 29 through the layer 28 of polyimide. These openings can be trenches, as has been shown in the three-dimensional view of FIG. 2b, or can be holes. The essence of the openings that are created through the layer 28 of polyimide is that the mold compound 16 can now penetrated into these openings 29, forming a considerably more solid bond between the layer 28 of polyimide and the overlying mold compound 16. An added advantage of the creation of openings 29 is that these openings can be created at no added cost to the process of creating a semiconductor package since these openings can be created at the same time and as part of creating openings overlying and exposing the contact pads 18 through the layer 28 of polyimide.

The creation of openings 29 is subject to a number of design parameters such as the density of the openings, the cross sectional dimensions of the openings in a plane that is parallel with the surface of die 10, the geometric shape of the cross section of the openings in a plane that is parallel with the surface of the die 10, whether these openings 29 are holes or trenches. These design parameters can be determined for each application and do not in any way detract from the method of the invention, that is to provide the ability for the mold compound to penetrate through the layer of polyimide, thus forming a solid bond between the layer of polyimide and the overlying layer of mold compound. The details as to how this penetration is implemented is design dependent and can be optimized on a per application basis.

FIG. 2c shows a top view of the layer 28 of polyimide of the invention. Openings 29' through the layer 28 of polyimide have in the top view of FIG. 2c been shown as squares or rectangles. It is clear that these openings, as previously stated, can have a cross section of any desirable geometric form and can for instance be trenches that may be created in parallel with one of the sides of the die 10 or that can be created under an angle with one of the sides of die 10. In addition, the density of the created openings in layer 28 is design dependent. Essentially, openings 29' are located overlying the die 10 in the center of the die, this however is again not a limitation of the invention. For instance, holes 29' may be clustered in a finite number of holes whereby that number of holes may be located off-center in the layer 28 of polyimide with respect to the center of die 10. In short: the design parameters of creating openings through the layer 28 of polyimide can be selected based on a particular application. The invention provides for the creation of the holes through layer 28 of polyimide in order to significantly enhance the adhesion between the layer 28 of polyimide and the thereover created deposition of mold compound.

The invention, of creating an interface layer over the surface of a semiconductor device, can be summarized as follows:

providing a semiconductor device, the semiconductor device having a first and a second surface with points of electrical contact to the semiconductor device having been provided in the second surface of the semiconductor device, the semiconductor device having been provided with a layer of passivation over the second surface of the semiconductor device, openings having been created through the layer of passivation exposing the points of electrical contact to the semiconductor device providing a semiconductor device mounting support having a first and a second surface, contact pads having been provided in the first or the second surface of the semiconductor device mounting support positioning the semiconductor device over the second surface of the semiconductor device mounting support, the first surface of the semiconductor device facing the second surface of the semiconductor device mounting support providing conductive interconnections between the points of electrical contact provided in the second surface of the semiconductor device and contact pads provided over the second surface of the semiconductor device mounting support providing an underfill for the semiconductor device depositing an interface layer, comprising polysilicon, over the surface of the layer of passivation, and patterning and etching the interface layer, creating at least one opening through the interface layer.

In addition, a layer of mold compound may be deposited over the surface of the interface layer, filling the at least one opening created through the interface layer.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for applying a stress relief interface layer over a semiconductor surface, comprising the steps of:
   providing a semiconductor surface;
   forming a stress relief interface layer over said semiconductor surface;
   creating openings through said stress relief interface layer before forming a layer of mold compound; and
   forming the layer of mold compound over a surface of the stress relief interface layer and filling the openings created through the stress relief interface layer.

2. The method of claim 1, said semiconductor surface being a surface of a semiconductor device.

3. The method of claim 1, said stress relief interface layer relieving stress introduced by mismatched Coefficients of Thermal Expansion (CTE) of thermally interacting layers.

4. The method of claim 1, wherein said stress relief interface layer comprising polyimide.

5. A method for applying a stress relief interface layer over a semiconductor surface, comprising the steps of:
   providing a semiconductor surface;
   forming a layer of polyimide over said semiconductor surface;
   creating openings through the layer of polyimide before forming a layer of mold compound; and
   forming the layer of mold compound over a surface of the layer of polyimide and filling the openings created through the layer of polyimide.

6. The method of claim 5, said semiconductor surface being a surface of a semiconductor device.

7. The method of claim 5, wherein said layer of polyimide relieving stress introduced by mismatched Coefficients of Thermal Expansion (CTE) of thermally interacting layers.

8. A method for applying a stress relief interface layer over a semiconductor surface, comprising the steps of:
   providing a semiconductor surface with a layer of passivation formed thereon;
   forming a stress relief interface layer over said layer of passivation;
   creating openings through said stress relief interface layer before forming a layer of mold compound; and
   forming the layer of mold compound over a surface of the stress relief interface layer and filling the openings created through the stress relief interface layer.

9. The method of claim 8, said semiconductor surface being a surface of a semiconductor device.

10. The method of claim 8, said stress relief interface layer relieving stress introduced by mismatched Coefficients of Thermal Expansion (CTE) of thermally interacting layers.

11. The method of claim 8, wherein said stress relief interface layer comprises polyimide.

12. A method for applying a stress relief interface layer over a semiconductor surface, comprising the steps of:
   providing a semiconductor surface with a layer of passivation formed thereon;

forming a layer of polyimide over said layer of passivation;

creating openings through the layer of polyimide before forming a layer of mold compound; and forming the layer of mold compound over a surface of the layer of polyimide and filling the openings created through the layer of polyimide.

13. The method of claim 12, said semiconductor surface being a surface of a semiconductor device.

14. The method of claim 12, wherein said layer of polyimide relieves stress introduced by mismatched Coefficients of Thermal Expansion (CTE) of thermally interacting layers.

* * * * *